(12) United States Patent
Holderer et al.

(10) Patent No.: US 7,354,168 B2
(45) Date of Patent: Apr. 8, 2008

(54) FACET MIRROR HAVING A NUMBER OF MIRROR FACETS

(75) Inventors: Hubert Holderer, Konigsbronn (DE); Andreas Heisler, Steinheim (DE); Wolfgang Singer, Aalen (DE); Markus Weiss, Aalen (DE); Andreas Seifert, Aalen (DE); Frank Melzer, Utzmemmingen (DE); Heinz Mann, Aalen (DE); Jurgen Faltus, Aalen (DE); Berndt Warm, Schwaig (DE); Stefan Dornheim, Heidenheim (DE)

(73) Assignee: Carl Zeiss SMT AG, Oberkochen (DE)

( * ) Notice: Subject to any disclaimer, the term of this patent is extended or adjusted under 35 U.S.C. 154(b) by 98 days.

(21) Appl. No.: 10/848,210

(22) Filed: May 18, 2004

(65) Prior Publication Data
US 2005/0030653 A1  Feb. 10, 2005

Related U.S. Application Data

(63) Continuation-in-part of application No. PCT/EP02/14748, filed on Dec. 23, 2002.

(30) Foreign Application Priority Data
Feb. 9, 2002  (DE) ................................ 102 05 425

(51) Int. Cl.
*G02B 5/09* (2006.01)
*G02B 7/182* (2006.01)

(52) U.S. Cl. ........................ 359/851; 359/853; 359/855; 359/865; 359/869; 359/872

(58) Field of Classification Search ................ 359/850, 359/851, 853, 855, 865, 872, 882, 869
See application file for complete search history.

(56) References Cited

U.S. PATENT DOCUMENTS

| 1,093,498 | A | * | 4/1914 | Thring ..................... 126/699 |
| 3,515,464 | A | * | 6/1970 | Peifer et al. ................ 359/833 |
| 4,087,682 | A | * | 5/1978 | Kolodziej ................... 362/297 |
| 4,110,009 | A | * | 8/1978 | Bunch ....................... 359/853 |
| 4,130,109 | A | * | 12/1978 | Brueck ..................... 126/685 |
| 4,195,193 | A | | 3/1980 | Grabbe et al. ........... 174/52 FP |
| 4,511,250 | A | * | 4/1985 | Olsen ........................ 356/225 |
| 4,740,276 | A | | 4/1988 | Marmo et al. ................ 204/7 |
| 6,154,302 | A | * | 11/2000 | Yagi et al. ................... 359/198 |
| 6,227,673 | B1 | * | 5/2001 | O'Hara-Smith ............ 359/850 |
| 6,563,569 | B2 | * | 5/2003 | Osawa et al. .............. 356/4.09 |
| 7,090,362 | B2 | * | 8/2006 | Holderer et al. ............ 359/851 |
| 7,246,909 | B2 | * | 7/2007 | Seifert et al. ............... 359/850 |

FOREIGN PATENT DOCUMENTS

| DE | 23 63 765 | 6/1975 |
| DE | 0 726 479 B1 | 5/2002 |
| EP | 0 901 992 A2 | 3/1999 |

(Continued)

*Primary Examiner*—Ricky D. Shafer
(74) *Attorney, Agent, or Firm*—GrayRobinson, PA

(57) ABSTRACT

A facet mirror (10) is provided with a number of mirror facets (11), in which the mirror facets (11) respectively have a spherical or conical facet body (17) with a reflecting surface (12). The side of the facet body (17) averted from the reflecting surface (12) is mounted in a bearing device (15).

6 Claims, 10 Drawing Sheets

FOREIGN PATENT DOCUMENTS

| | | |
|---|---|---|
| EP | 0 916 984 A1 | 5/1999 |
| GB | 2 255 195 A | 10/1992 |
| JP | 62054210 | 3/1987 |
| JP | 07199038 | 8/1995 |
| JP | 09096757 | 4/1997 |
| JP | 2000167683 | 6/2000 |
| RO | 101091 | 12/1992 |
| WO | WO 98/14815 | 4/1998 |

* cited by examiner

FACET MIRROR HAVING A NUMBER OF MIRROR FACETS

CROSS REFERENCE TO RELATED APPLICATIONS

This is a continuation-in-part of, and claims priority to, International Application Number PCT/EP02/14748 filed Dec. 23, 2002 which designated the United States and at least one other country other than the United States, and which in turn, claims priority to German application number 102 05 425.8 filed Feb. 9, 2002.

BACKGROUND OF THE INVENTION

1. Field of the Invention

The invention relates to a facet mirror having a number of mirror facets that can be used in illuminating devices for projection exposure machines in microlithography, in particular when employing radiation in the region of the extreme ultraviolet.

2. Description of the Related Art

Tilting mirrors as mirror facets for facet mirrors comprising a number of these mirror facets are known from the prior art.

Thus, for example, GB 2 255 195 A describes such facet mirrors having individual tilting mirrors and appropriate bearing elements for the facet mirrors, whose intended use is to be looked for, in particular, in the field of solar energy technology.

Each individual one of the tilting mirrors is constructed in this case such that it comprises a mirror surface which is connected via a rod to a sphere which is fastened in appropriate bearing devices. The accuracy of such arrangements with regard to the possibility of adjusting them or the like is extremely limited in this case, since the individual tilting mirrors are held in a comparatively loose fashion and maladjustment can come about very easily and quickly.

In the case of such a design, it is therefore certainly impossible to implement the accuracies which are required in the adjustment and which are necessary for the case of application for the abovenamed invention in a projection exposure machine for microlithography, in particular for use with radiation in the region of the extreme ultraviolet (EUV). Furthermore, it is possible during adjustment to access the individual mirror facets only from the side of their reflecting surface, and so it is comparatively complicated and difficult to align the individual mirrors when they are illuminated.

Moreover, EP 0 726 479 A2 describes a tilting mirror arrangement which has at least one tilting mirror, a basic body and at least one mirror bearing with an at least virtually fixed fulcrum between the tilting mirror and the base. In accordance with the document, in the case of mirror surfaces with a characteristic length of less than 40 mm, the overall size of the total arrangement of tilting mirror bearing and tilting mirror housing is arranged below the reflecting surface in such a way that, when projected onto the mirror plane, it does not project beyond it, or does so only slightly when the tilting mirror is deflected. Such tilting mirrors are used, for example, in the field of laser technology.

Such mirrors can also be adjusted when illuminated, owing to the possibility of mounting the basic body correspondingly via the mirror bearing and readjusting it, if appropriate. However, the design is very complicated, and so a very high outlay on the overall space in the axial direction, the adjusting elements, the costs and the like is to be expected in the case of facet mirrors which could be formed from these tilting mirrors.

DE 23 63 765 discloses a bearing for a pivotable mirror for coherent optical systems. The mirror is arranged in this case on the circular surface of a spherical segment, the center of the sphere lying on the reflecting surface. The spherical segment is mounted in a spherical pan or spherical cap of corresponding diameter. The spherical segment is provided for the purposes of movement and control with a lever-shaped extension arranged radially relative to the sphere. In this case, the extension can be moved by means of an adjusting device active in a plane parallel to the plane of the neutral position of the mirror.

Reference may be made to U.S. Pat. No. 6,276,066 for the further prior art.

SUMMARY OF THE INVENTION

It is the object of the invention to avoid the above-named disadvantages of the prior art, and to provide a facet mirror, having a number of mirror facets, which is of very simple design and which can satisfy the very high demands with regard to the optical quality and with regard to the resolution of the adjustment of the individual mirror facets, such as occur in microlithography, in particular in EUV lithography.

This object is achieved according to the invention by virtue of the fact that the mirror facets respectively have a spherical or conical facet body with a reflecting surface, the side of the facet body averted from the reflecting surface being mounted in a bearing device.

The reflecting surface can be fixed or fitted on an intermediate element or directly on the facet body, which serves simultaneously as, bearing body for bearing the mirror facet in the bearing device. This creates a design that permits each mirror facet to be capable of being adjusted freely and independently of the other mirror facets. The design comprising a sphere or a cone as mirror body and bearing body is very simple and cost effective in this case.

In a very advantageous refinement of the invention, it can be provided that the facet body is mounted adjustably in the bearing device, which is arranged in a carrier plate for the mirror facets.

Owing to the adjustability, the individual mirror facets of a facet mirror can be adjusted independently of one another and exactly. It can be provided for this purpose that the facet body is provided on the side averted from the reflecting surface with a guide member on which control means for adjusting the facet body act.

A symmetrical design is provided in an advantageous refinement of the invention. The symmetrical design can be performed relative to the axis of symmetry of a mirror facet that extends in the longitudinal direction through the facet body and the guide member.

The effect of a symmetrical design is that the fastening and adjustment exhibit no preferred directions. In the event of thermal loading, no forces are produced perpendicular to the axis of symmetry of the mirror facets. A very high accuracy is achieved in this way in the adjustment. Smooth adjusting surfaces thereby permit adjustments in the microradian range.

Because of the possibility of adjustment with the aid of the control means acting on the guide member, there is no need in the region of the optically active front side of the facet mirror for any kind of additional actuators or sensors that would be exposed to stress from the radiation. Control means of any sort can be arranged in the region of the guide member on the side of the facet mirror averted from the mirror facet. Depending on the design, in addition to a pure maladjustment, the control means permit the mirror facets to be reliably held in their prescribed position or in the prescribed alignment of the surface normals of the reflecting surface of each of the mirror facets. It is thereby possible with the aid of simple configurations that can be designed to save space to achieve a design that entirely fulfills the abovenamed requirements and, that, moreover, has a high degree of long term stability and is very well protected against mechanical impairment through shocks, vibrations and the like, since the lever element, and thus the mirror facet, can not only be adjusted, but also held in place by the control means.

Further advantageous refinements of the invention emerge from the remaining subclaims and from the exemplary embodiments illustrated below with the aid of the drawings.

Figure 1:
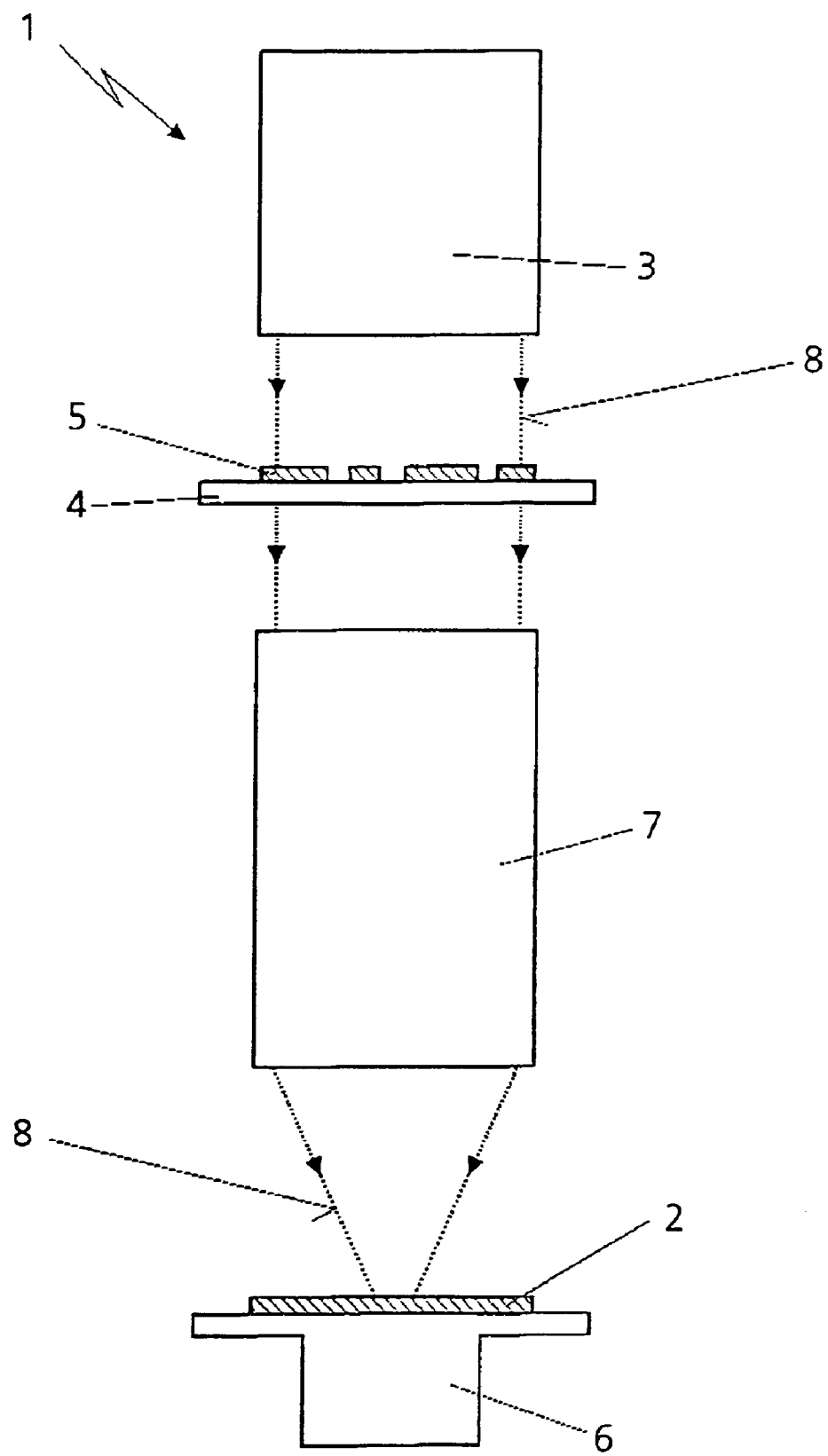
FIG. 1 shows a block diagram of a projection exposure machine for microlithography, that can be used to expose structures on wafers coated with photosensitive materials.

A protection exposure machine 1 for microlithography is illustrated in FIG. 1. This machine serves to expose patterns on a substrate coated with photosensitive materials and which generally consists predominantly of silicon and is denoted as a wafer 2, the purpose being to produce semiconductor components such as, for example, computer chips.

The projection exposure machine 1 essentially consists in this case of an illuminating device 3, a device 4 for accommodating and exactly positioning a mask provided with a grid-like pattern, a so-called reticle 5, by means of which the later patterns on the wafer 2 are determined, a device 6 for holding, moving on and exactly positioning this very wafer 2, and an imaging device 7.

The fundamental functional principle provides in this case that the patterns introduced into the reticle 5 are exposed on the wafer 2, in particular with the accompaniment of a reduction in the patterns to a third or less of the original size. The requirements to be placed on the projection exposure machine 1, in particular on the imaging device 7, as regards the resolutions are this in case in the range of a few nanometers.

After the wafer 2 has been exposed, it is moved further such that a multiplicity of individual fields, each having the pattern prescribed by the reticle 5, are exposed on the same wafer 2. Once the entire area of the wafer 2 has been exposed, the latter is removed from the projection exposure machine 1, and subjected to a plurality of chemical treatment steps, generally a removal of material by etching. If appropriate, a number of these exposure and handling steps are traversed one after another until a multiplicity of computer chips have been produced on the wafer 2. Because of the stepwise forward movement of the wafer 2 in the projection exposure machine 1, the latter is frequently also denoted as a stepper.

The illuminating device 3 provides a projection beam 8, for example light, or a similar electromagnetic radiation, for the imaging of the reticle 5 on the wafer 2. A laser or the like can be used as source for this radiation. The radiation is shaped in the illuminating device 3 via optical elements such that upon impinging on the reticle 5 the projection beam 8 has the desired properties as regards diameter, polarization, shape of the wavefront and the like.

Via the projection beam 8, an image of the reticle 5 is produced and, as already explained above, transferred onto the wafer 2 in an appropriately reduced fashion by the imaging device 7. The imaging device 7, which could also be denoted as objective, consists in this case of a multiplicity of individual refractive and/or diffractive optical elements such as, for example, lenses, mirrors, prisms, end plates and the like.

Figure 2:
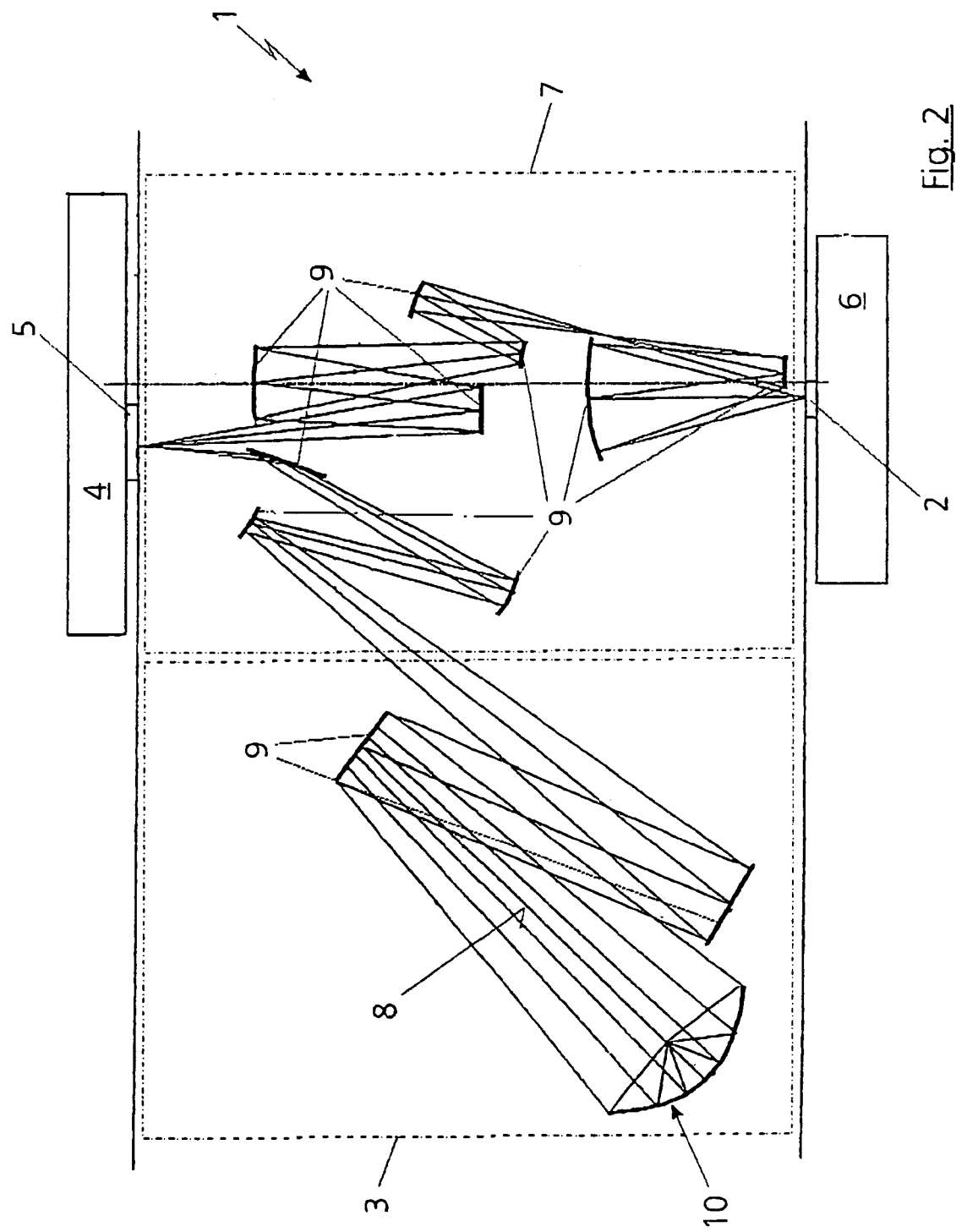
FIG. 2 shows a block diagram of a projection exposure machine for microlithography, as it can be used when employing it with radiation in the region of the extreme ultraviolet.

FIG. 2 shows a diagram of a principle of a design similar to FIG. 1, but here for use with a projection beam 8 whose wavelength is in the region of the extreme ultraviolet (EUV). In the case of these wave-lengths, generally approximately 13 nm, the use of refractive optical elements is no longer possible, and so all the elements must be designed as reflecting elements. This is illustrated here by the numerous mirrors 9. Except for the course of the projection beam 8, the projection exposure machine 1 illustrated here, which can be used for EUV lithography, is comparable in design to the projection exposure machine 1 already described in FIG. 1. The same elements of the device in this case have the same reference numerals, and so more detailed explanations are to be dispensed with at this juncture.

Arranged in this case in the area of the illuminating device 3 indicated here by the dashed and dotted line is a facet mirror 10 that is of decisive importance for the quality and homogeneity of the projection beam 8. The following explanations relate to the design of such a facet mirror 10 as can be used very generally in microlithography, but in particular in the illuminating system 3 for EUV lithography.

Figure 3:
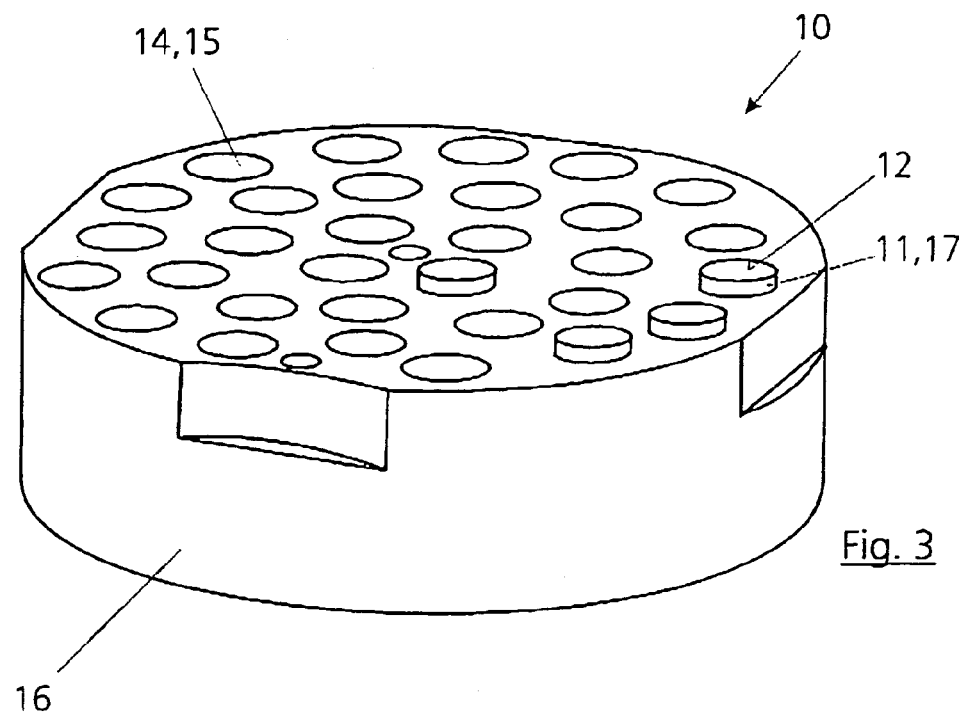
FIG. 3 shows a possible design of a facet mirror in accordance with the invention.

FIG. 3 shows by way of example a possible design of the facet mirror 10 having individual mirror facets 11. Each of the mirror facets 11 has a reflecting surface 12 that is suitable for the reflection of radiation. The design of the reflecting surface 12 can vary, depending on the type of the radiation used such as, for example, light, UV radiation, X radiation or the like. It is possible here to think of various designs comprising in part a large number of multilayer coatings applied to a substrate, for example vapor deposited thereon. The reflecting surface 12 can in this case be applied directly to the mirror facet 11, or else to an intermediate element 13 (not illustrated here; to be seen in FIG. 6). The use of the intermediate element 13 is very favorable in this case particularly where use is being made of very short wave radiation, for example radiation in the region of the extreme ultraviolet (EUV), since it is necessary here to place very high demands on the surface quality of the reflecting surface 12, and thus also of the surface below this reflecting surface 12. When, however, use is made of the intermediate element 13 the outlay on fabricating the entire mirror facet 11 from a material that permits its surface to be processed in such an effective way as that required for the reflection of EUV radiation is then eliminated.

In order to form the facet mirror 10, each individual one of the mirror facets 11 is seated in this case in an accommodating opening 14 as bearing device 15 for the mirror facets 11. The accommodating openings 14 are arranged here in a carrier plate 16. The individual mirror facets 11, only a few of which are illustrated here, have, at least in the region where they are seated on the bearing devices 15, the form of a facet body 17 that bears the reflecting surface 12, directly or on the intermediate element 13, in a recess 18 (not discernible here; illustrated in FIG. 4).

Figure 4:
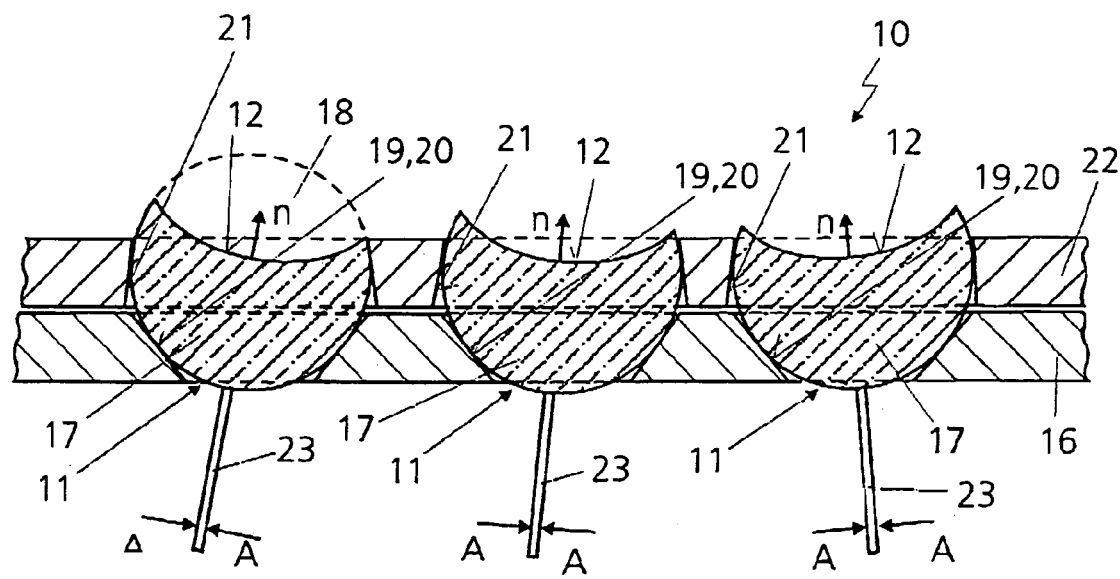
FIG. 4 shows a cross section through a possible alternative design, in principle, of a facet mirror in accordance with the invention.

A part of the facet mirror 10 is illustrated in FIG. 4 in an alternative embodiment. In particular, the configuration of the mirror facets 11 is more clearly evident here. In the detail of the exemplary embodiment illustrated here, the facet mirror 10 has three of the mirror facets 11. Each of the mirror facets 11 has a spherical facet body 17. Located in each of the facet bodies 17 is the recess 18, which is provided with a reference numeral here only at one of the facet bodies 17, which has been-supplemented with the aid of a dashed line to produce the cross sectional shape of a sphere. The remaining surface of the facet body 17 in the region of this recess 18 then forms the reflecting surface 12, which is additionally symbolized in each case in FIG. 4 by its surface normal n. Depending on the purpose of use for the facet mirror 10, the reflecting surface 12 can be configured so as to produce a spherical, plane or aspheric reflecting surface 12. In general, the reflecting surface 12 will be of spherical construction for the preferred purpose of use in EUV lithography, the radius of the reflecting surface 12 being very much greater than the radius of the facet body 17.

Each of the mirror facets 11 is mounted in the bearing device 15. In the exemplary embodiment illustrated here, the bearing device 15 comprises a conical bore 19 which is introduced into the carrier plate 16. The facet body 17 lies in this conical bore 19 whose larger opening diameter is arranged in this case such that the facet body 17 lies in the conical bore 19 but cannot fall through the latter. Thus, in the region of the conical bore 19 or the bearing device 15, an annular seating surface 20 is produced between the facet body 17 and the carrier plate 16.

Moreover, in the exemplary embodiment illustrated here the facet mirror 10 has devices for reliably retaining the facet body 17. In accordance with the exemplary embodiment illustrated here, these devices are constructed as a further conical bore 21 that is introduced into a holding plate 22. The larger opening diameter of the further conical bore 21 is arranged such that it faces the carrier plate 16.

It is particularly favorable for the ideal mode of operation when an adjusting device is fitted at each of the mirror facets 11 on its side averted from the mirror surface 12. This adjusting device can be constructed, for example, as a guide member 23 connected to the facet body 17. Via such a guide member 23, which projects through the conical bore 19 in the carrier plate 16, the facet mirror 10 can thus be adjusted, under illumination, from behind, that is to say from its side averted from the illumination, that is to say under the conditions provided for correct operation. The transmission ratio between the movement of the reflecting surface 12 or its surface normal n and the deflection of the guide member 23 can be set in this case by the length of the guide member 23. It is particularly rational in this case when the guide member 23 is constructed to be aligned with the surface normal n of the reflecting surface 12 so that the directions of movement of the surface normal n and of the guide member 23 run oppositely in parallel. A very simple adjustability that is easy to understand is thereby ensured. The positional accuracy achieved in this case for the tilting angle of the mirror facets is in the range of seconds.

It is particularly favorable when the position of the reflecting surface 12 is adjusted via appropriate forces on the side of the guide member 23 averted from the facet body 17. These forces can be applied to the guide member 23, for example via actuators which are indicated in principle here by the arrows A. Conceivable here as actuators are all known forms of actuators, or active or passive control means which, for example, use pneumatic, hydraulic, piezoelectric, magnetic or mechanical forces.

The procedure in mounting and adjusting such a facet mirror 10 is such that the mirror facets 11 are inserted into the conical bores 19 of the carrier plate 16. Thereafter, the holding plate 22 with its conical bores 21 is positioned above the mirror facets 11 and lowered. The two plates 16, 22 then lie loosely on one another such that the mirror facets 11 can still be varied via the guide members 23 with regard to the alignment of the surface normal n of the reflecting surface 12. With the entire facet mirror 10 illuminated, each individual reflecting surface 12 of the facet mirror 10 is then adjusted via appropriate force actions on the guide member 23. As soon as the position of all the mirror facets 11 is adjusted in the way desired, this position is fixed by pressing the first and second plates 16, 22 against one another. It is particularly favorable in this case when the carrier plate 16 is constructed from a material which is much softer than the material of the facet bodies 17. Conceivable here, for example, would be a material combination of a ceramic or crystalline material for the facet bodies 17 and a soft metal, such as brass, copper or aluminum, for the carrier plate 16. By comparison therewith, the holding plate 22 should be constructed from a material which is somewhat harder than the material of the carrier plate 16 but which is also much softer than the material of the facet bodies 17. This ensures that upon the two plates 16, 22 being pressed together, the facet bodies 17 are easily pressed into the carrier plate 16, and that the fixing of their position is then ensured by friction forces (even in the case of vibrations, shock or the like).

Should the final position of the mirror facet 11 or the alignment of its surface normal n have experienced a maladjustment as the plates 16, 22 were pressed together, something which can happen, for example, by screwing the two plates 16, 22 together, it is then possible, by loosening this screwed connection and by pressing the two plates 16, 22 apart by means of, for example, compressed air introduced therebetween, to achieve a state in which the friction between the carrier plate 16 and the facet bodies 17 is reduced to such an extent that renewed adjustment is possible before the two plates 16, 22 are then pressed against one another or screwed to one another again after adjustment has been performed.

In order to ensure the finally set position of the individual mirror facets, the latter could also still be bonded or soldered to at least one of the plates 16, 22 as well.

Figure 5:
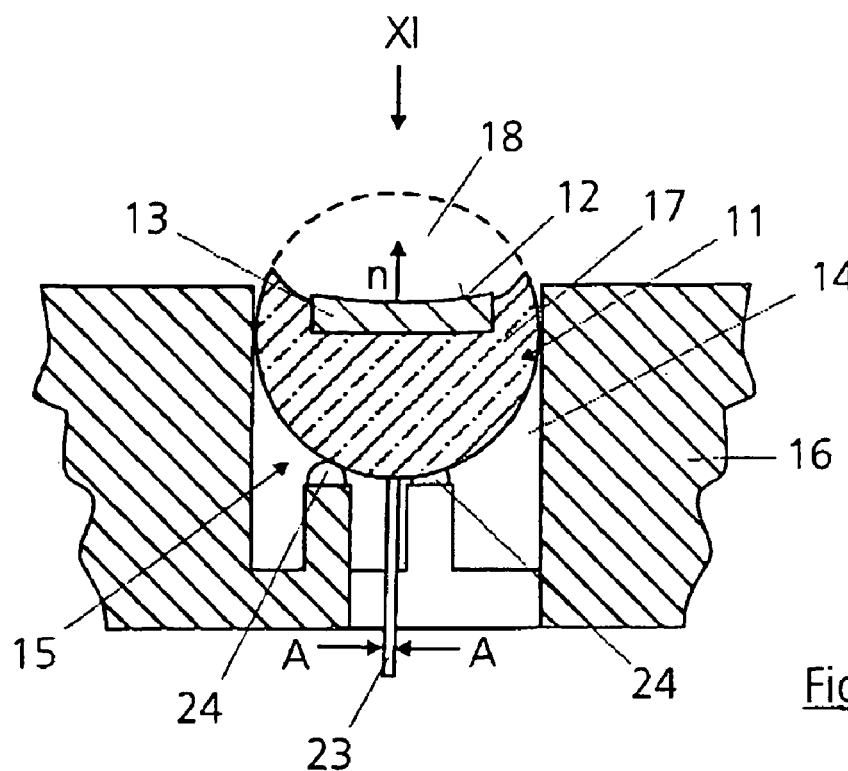
FIG. 5 shows a cross section through an alternative embodiment of a mirror facet in an alternatively constructed bearing device.

FIG. 5 illustrates an alternative embodiment of the mirror facet 11 both with regard to the mirror facet 11 itself and with regard to the bearing devices 15. Here, again, the mirror facet 11 comprises the facet body 17 and is provided with the guide member 23 for adjustment. By contrast with the previously illustrated mirror facets 11, however, here the intermediate element 13 already mentioned above is to be seen; it carries the reflecting surface 12 and is introduced into the recess 18 of the facet body 17. The intermediate element 13, which will generally comprise a mirror substrate, can be introduced in this case into the region of the recess 18 in the facet body 17 using conventional methods. It would certainly be particularly expedient to use such methods as wringing, bonding or soldering such that radiation not reflected by the reflecting surface 12 and absorbed in the region of the intermediate element 13, which is converted into heat, can ideally be dissipated at the facet body 17. This minimizes impairment of the shape of the reflecting surface 12 owing to thermal stresses and the like.

In the exemplary embodiment illustrated in FIG. 5, the facet body 17 of the mirror facet 11 now rests on a bearing device 15 with the aid of which the facet body 17 forms an at least approximately punctiform contact in the region of three bearing elements 24 that can be constructed as balls, for example.

Figure 6:
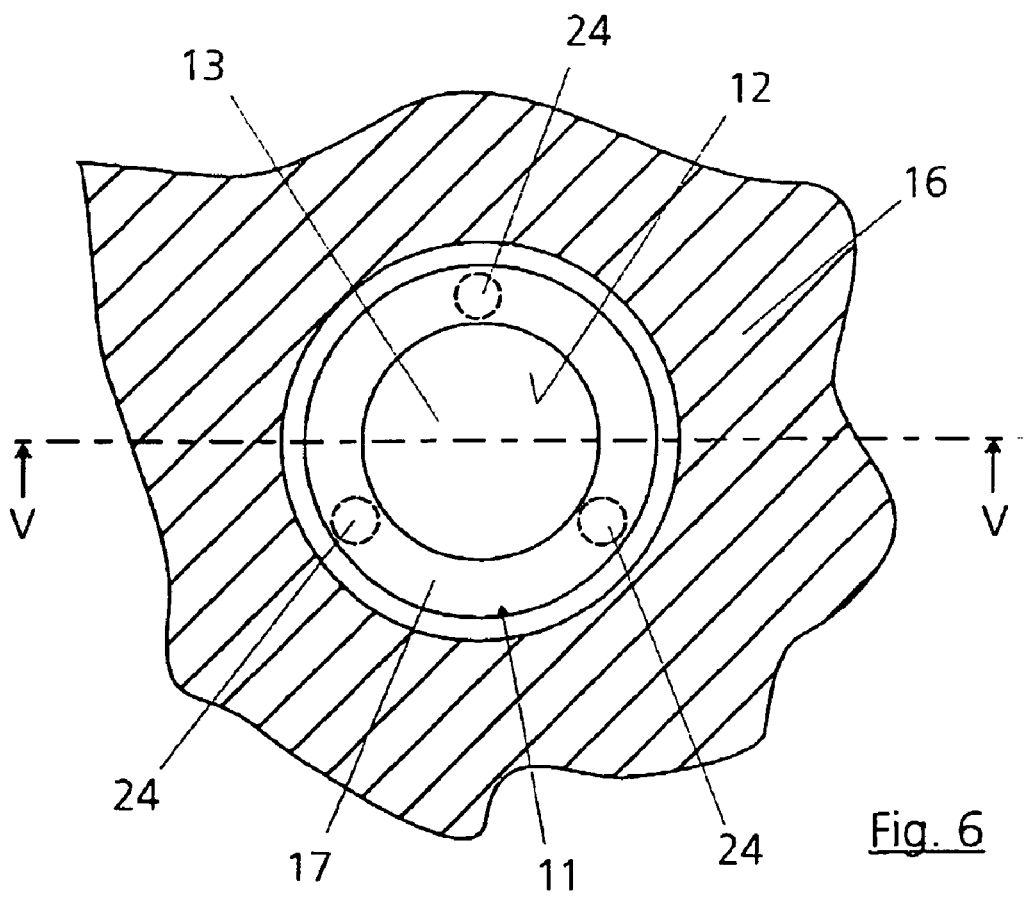
FIG. 6 shows a plan view of the mirror facet in accordance with FIG. 5.

The same mirror facet 11 is illustrated once again in FIG. 6 in a plan view. It is clearly to be seen here that the three seating bodies 24 are constructed as a true three-point bearing and are arranged at an angle of 120° to one another in each case. The particularly favorable properties of such three-point bearings are known here per se and made use of in the embodiment illustrated in FIGS. 5 and 6 in a way similar to known bearing devices 15 of such type.

Figure 7:
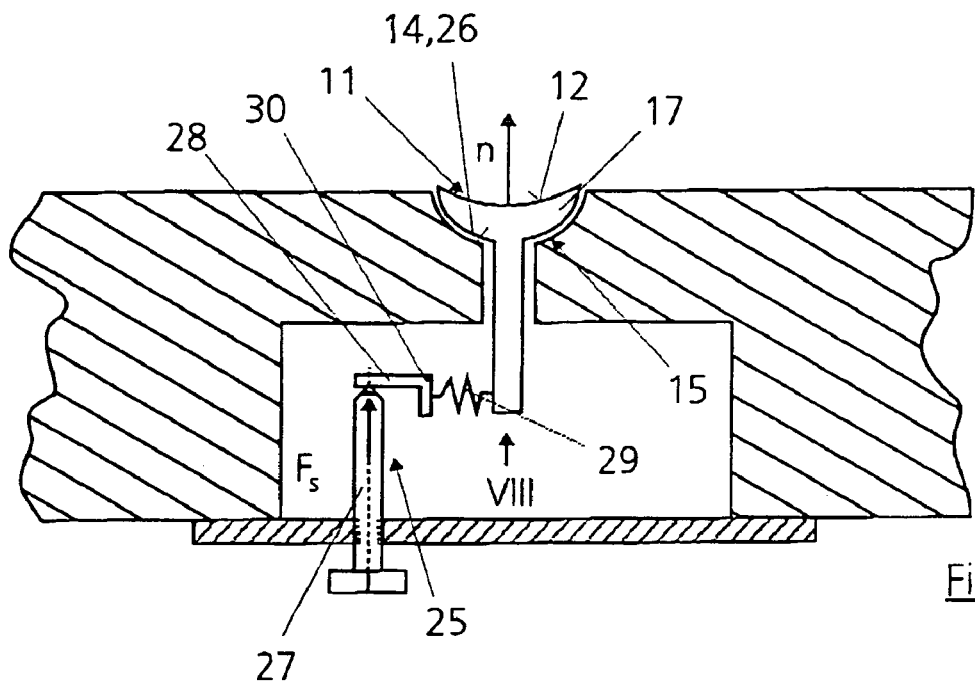
FIG. 7 shows an apparatus for adjusting the position of one of the mirror facets in a further alternatively constructed bearing device.

FIG. 7 illustrates a device 25 for adjusting the position of one of the mirror facets 11 in the carrier plate 16. Also to be seen in FIG. 7 is a further embodiment of the bearing devices 15. In the exemplary embodiment illustrated here, the accommodating opening 14 is constructed as a spherical cup 26 that corresponds in diameter to the diameter of the facet body 17 of the mirror facet 11.

Moreover, the actuators so far only indicated in principle via the arrows A, are illustrated as the concrete control means 27 in the exemplary embodiments now following. In accordance with the exemplary embodiment of FIGS. 7 and 8, the device 25 comprises one of the control means 27, constructed here as a screw, a transmission element constructed as a lever 28, and a spring means 29. This design just described, composed of control means 27, lever 28 and spring means 29 has a three-fold presence in this case in accordance with the exemplary embodiment illustrated here, as may be seen in the view in accordance with FIG. 8.

The action of force by the control means is illustrated in FIG. 7 via the force arrow $F_S$. This positioning force s acts on the lever 28; in the exemplary embodiment illustrated here, it acts on the longer arm of the lever 28. The lever 28 can rotate here about a fulcrum 30 that is stationary relative to the carrier plate 16. The shorter limb of the lever 28, which is connected to the spring means 29, will thereupon execute a movement that stresses the spring means such that the guide member 23 of the mirror facet 11 is moved in the direction of the lever 28. The mirror facet 11 is therefore deflected.

Figure 8:
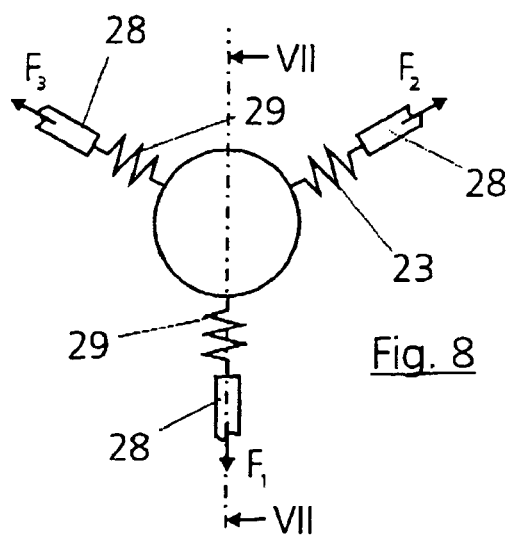
FIG. 8 shows a view of a part of the apparatus in accordance with FIG. 7, from below.

This design is to be seen yet more effectively in FIG. 8. Depicted here are the respective forces $F_1$, $F_2$ and $F_3$, which are set on the basis of a positioning force $F_S$ acting as in the exemplary embodiment in accordance with FIG. 7. Actuation of the control means 27, of which there are likewise three, means that it is then possible to reach the exact positioning of the mirror facet 11 with regard to the alignment of the surface normal n of the reflecting surface 12.

Figure 9:
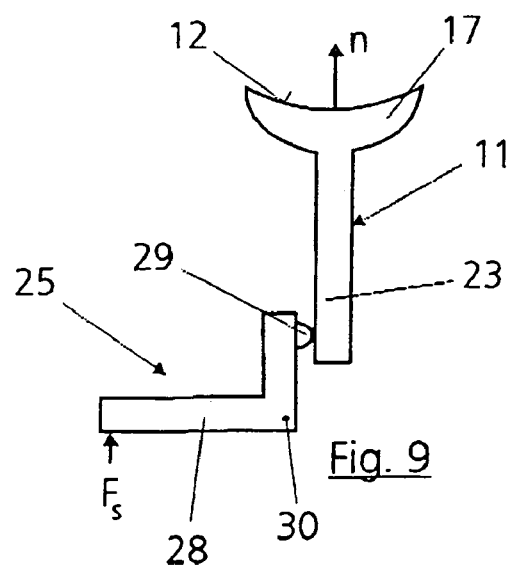
FIG. 9 shows a part of an alternative refinement of an apparatus for adjusting the position of one of the mirror facets.

FIG. 9 shows a greatly simplified and schematic illustration of a further functional principle of an alternative embodiment of the device 25. Present here, as well, is a lever 28, which can rotate about a fulcrum 30 that is fixed relative to the carrier plate 16 (not illustrated). The lever 28 is actuated, in turn, by a control means 27, which is arbitrary per se and indicated here only by the positioning force $F_S$. The lever rotates, as already mentioned, about the fulcrum 30, and shifts toward the guide member 23 of the facet mirror 11 with the aid of a spring means 29 implemented as compression spring means in the exemplary embodiment illustrated here. Owing to the design, it is possible here to achieve a possibility of adjustment comparable to that already represented above in the description of FIGS. 7 and 8.

Figure 10:
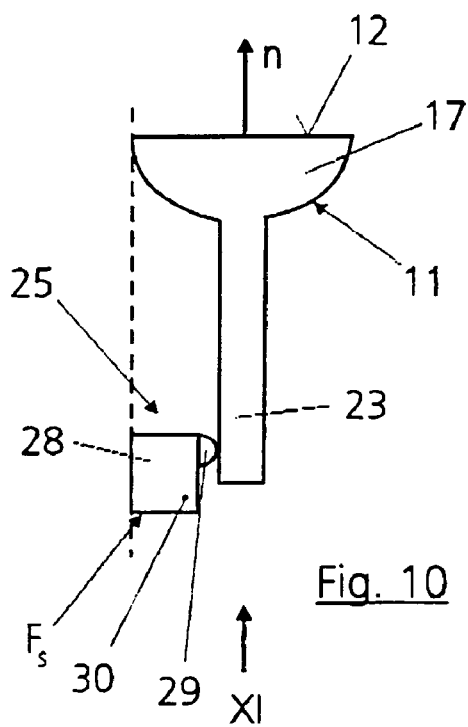
FIG. 10 shows a part of a further alternative refinement of an apparatus for adjusting the position of one of the mirror facets.

FIG. 10 illustrates a further alternative embodiment of the design in accordance with FIG. 9, regard having been paid here, in addition, to miniaturizing the entire device 25. Here, as well, the design is comparable to the embodiments described above, the embodiment of the lever 28 being implemented as a rectangular block. This rectangular block, which constitutes the lever 28, can be formed in this case to be so small that it fits under the projection surface of the largest diameter of the mirror facet 11, and so the device 25 requires an extremely small overall space.

The design in accordance with FIG. 10 in this case obeys the same functional principle as the design, already described above, in accordance with FIG. 9, since this one also has a spring means 29 constructed as compression spring means.

Figure 11:
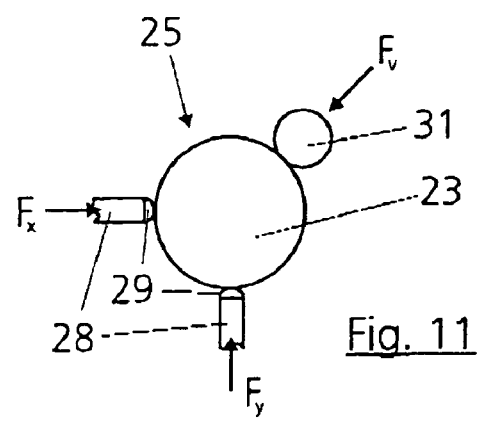
FIG. 11 shows a view of a part of the apparatus in accordance with FIG. 10, from below.

However, it is conceivable in principle to manage with only two control means or positioning forces $F_S$ when using such a design as illustrated in FIGS. 9 and 10. FIG. 11 shows such a design. The, two levers 28 are to be seen again in FIG. 11 in the view in accordance with the arrow XI in FIG. 10. Since the action of the positioning force $F_S$ is perpendicular to the plane of the drawing, the forces $F_X$ and $F_Y$ resulting therefrom are illustrated here, these being exerted on the guide member 23 by the lever 28. Because of the alignment of the levers 28, the actions of these two forces are at an angle of 90° to one another, and so it is possible to implement a movement of the guide member 23 in the x-direction ($F_X$) with the aid of one of the control means 27 (not illustrated here), and a movement of the guide member 23 in the y-direction ($F_Y$) with the aid of the other control means 27 (not illustrated here).

It would also be possible in this case to dispense with the compression spring means 29 given the design illustrated here, and so it would also be conceivable to use dedicated control means instead of the lever 28 in order to act in the direction of the illustrated forces $F_X$ and $F_Y$. In the exemplary embodiment illustrated here, there is located at an angle of 135° in each case to the forces $F_X$ and $F_Y$ a spring means 31 that exerts an action of force $F_V$ in the direction of the center of the guide member 23. This spring means 31 could be, for example, a bar spring that runs tilted at a slight angle toward the parallel to the guide member 23 and which thus presses the guide member 23 against the two levers 28. Such a design composed of the forces $F_X$ and $F_Y$ serving as positioning forces and of the biasing force $F_V$ owing to the spring means 31 results in a design where the control means 27 permit the guide member 23 to be adjusted directly in Cartesian coordinates.

Figure 12:
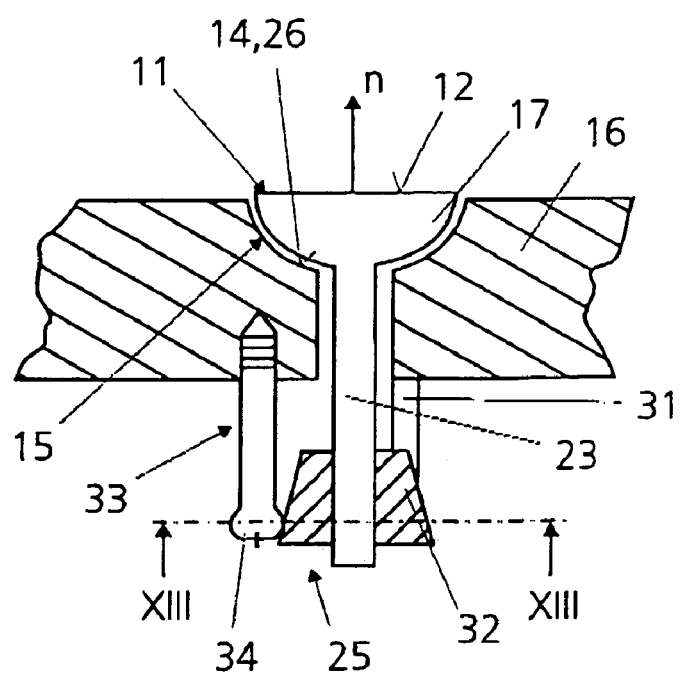
FIG. 12 shows an additional alternative refinement of an apparatus for adjusting the position of one of the mirror facets.

A further alternative embodiment of the device 25 is illustrated in FIG. 12. In this design of the device 25, the end of the guide member 23 averted from the reflecting surface 12 is provided with a cone 32 that tapers in the direction of the reflecting surface 12 in the case illustrated here. Here, a set-screw 33 that is of spherical configuration in the region of its screwhead 34 runs parallel to the guide member 23 of the facet mirror 11. The spherical surface of the screwhead 34 makes contact in this case with the cone 32, which is arranged on the guide member 23 of the facet mirror 11. By adjusting the set-screw 33, the locating surface migrates along the cone, between the spherical screwhead 34 and the cone 32, in the direction of the reflecting surface 12 or in the opposite direction.

Figure 13:
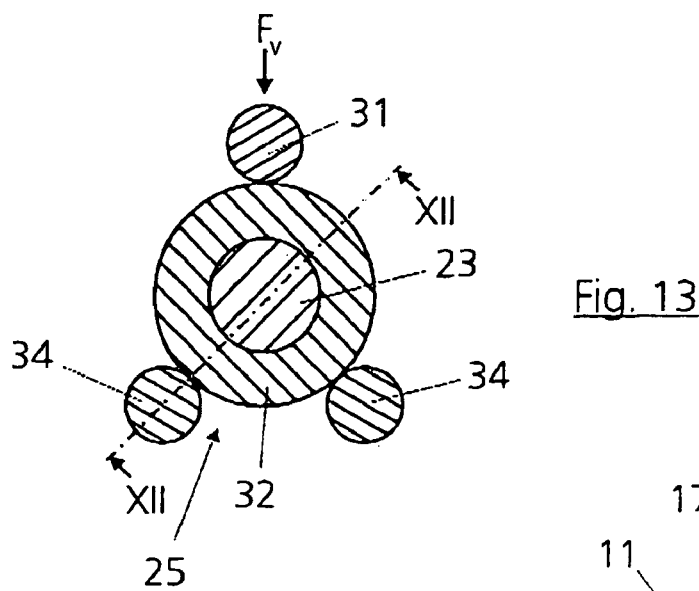
FIG. 13 shows a sectional illustration in principle in accordance with the line XIII-XIII in FIG. 12.

In order to manage with as few components as possible, a design corresponding in principle to that shown in FIG. 11 is selected for setting the position of the mirror facet 11 or the surface normal n of its reflecting surface 12. This design is indicated in FIG. 13, and has two of the setscrews 33. These setscrews 33 are then opposed by a corresponding spring means 31 in order to produce a biasing force $F_V$ on the guide member 23. The mode of operation and the arrangement are comparable to the mode of operation in FIG. 11. A direct setting in Cartesian coordinates can thus be effected with a minimum outlay on components.

The extent to which the screw 33 bears the spherical screwhead 34 and to which the cone 32 is fitted on the guide member 23 are not significant here. It would also be entirely conceivable for this to be reversed such that a spherically constructed surface 32' on the guide member 23 strikes a corresponding conical surface 34' in the region of the setscrew 33, as,is indicated in principle in FIG. 14. Again, the mode of operation is not affected in principle by the alignment of the cone 32 or 34', that is to say by the fact that the latter tapers or expands in the direction of the reflecting surface 12.

Figure 14:
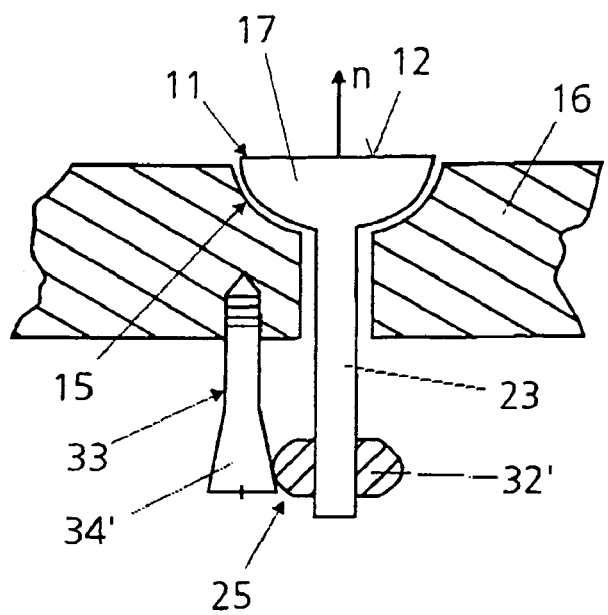
FIG. 14 shows an alternative design of a detail of the refinement of the apparatus in accordance with FIG. 12.

Just like the design in accordance with FIG. 10, the design in accordance with FIGS. 12, 13 and 14 is extremely space saving, and so the individual mirror facets 11 can be placed very directly in the facet mirror 10 despite the fact that their surface normals n are freely adjustable.

Figure 15:
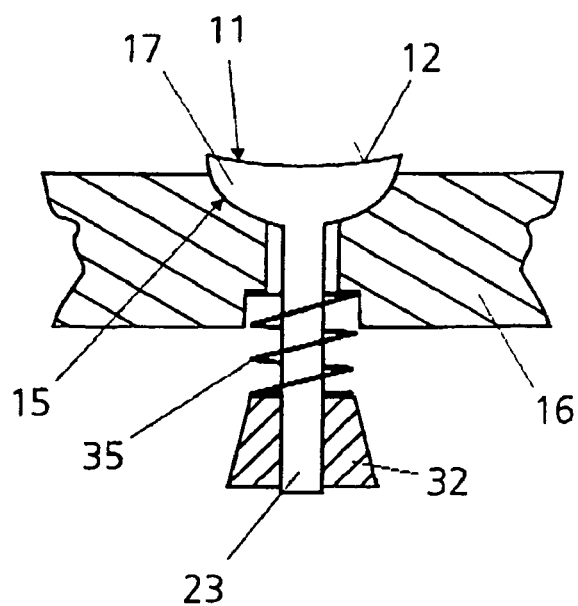
FIG. 15 shows a diagram of the principle of a possible device for increasing the friction of the mirror facet in the bearing device.

FIG. 15 now illustrates a possibility provided in principle which can be used to ensure that a somewhat higher degree of friction occurs between the facet body 17 and the bearing device 15, in the last-illustrated exemplary embodiments of the spherical cap 26 in each case, so that the position of each of the mirror facets 11 is reliably held once it has been set. In the exemplary embodiment illustrated here, a spring means 35 is fitted between the cone 32 and the carrier plate 16 as such a device for retaining the mirror facet 11. This spring means 35, which is constructed here as a compression spring means, applies a force to the cone 32 and thus to the guide member 23 connected to it, such that the facet body 17 presses firmly against the spherical cap 26, and the friction occurring between these two elements is correspondingly increased. The mirror facet 11 is thus held securely in its position even in the event of vibrations and/or shocks.

Figure 16:
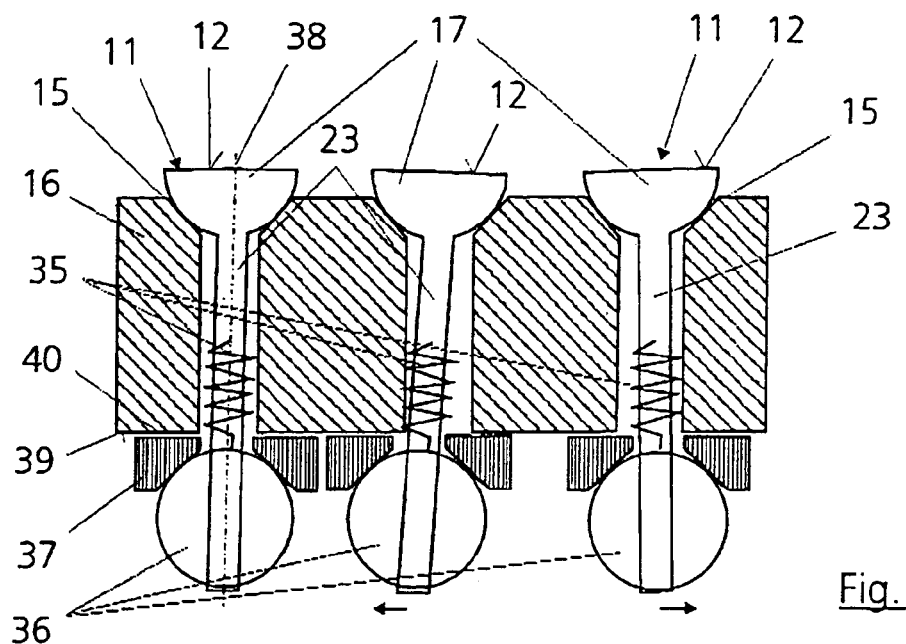
FIG. 16 shows a cross section through a further refinement of a facet mirror with a facet body as abutment.

FIG. 16 resembles the configuration according to FIG. 15, instead of the cone 32 each mirror facet 11 having in each case on the side of the guide member 23 averted from the facet body 17 a ball 36 as spherical bearing member, which is mounted in a conical receptacle of a holding plate 37. The spring means 35 ensures biasing between the bearing device 15 for the facet body 17 and the ball 36 as abutment. The guide member 23 is arranged with play in the carrier plate 16. This means that when positioning forces act transverse to the axis of symmetry 38 of a mirror facet 11 and displace the holding plate 37 along a setting surface 39 between the carrier plate 16 and the holding plate 37, the guide member 23 can be tilted relative to the carrier plate 16 for the purpose of exact setting and adjustment. This setting and adjustment can therefore be undertaken separately for each mirror facet 11. FIG. 16 illustrates three different positions for the three illustrated mirror facets 11 with reference to their tilting direction.

The bearing device 15 and the bearing receptacle for the balls 36 should be as similar as possible, so that as high as possible a degree of symmetry is achieved. The bearing can be designed without play owing to the biasing via the spring means 35. In addition, mutually touching surfaces can be coated after precise fabrication with an additional, thin, plastically deformable layer 40, as is indicated in FIG. 16 only for the setting surface 39, for the sake of simplicity.

All surfaces that come into contact with one another, such as the setting surface 39, the external ball surfaces and the seating surfaces of the balls, should be fabricated with very slight roughness.

The alignment and adjustment of the mirror facets 11 by applying positioning forces to the respective holding plates 37 can be performed manually or with the aid of special adjusting devices (not illustrated). The adjusting devices can be integrated into the assembly, or else constitute separate assemblies. Mechanical, high-precision elements, or else electrically driveable actuators, for example, come into consideration as adjusting elements.

After an exact adjustment, the mirror facets 11 are fixed on the carrier plate 16. Use may be made for this purpose of, for example, screwed joints, bonded joints or elements that can be varied using electrical or thermal effects such as, for example, piezo actuators or memory metals.

A plateau can be provided in the force-displacement diagram for the spring means 35, because then it is possible for biasing forces to remain equal during changes in length owing to thermal influence or to deflections of different strength. In the case of normal springs, the spring excursion is directly proportional to the force. In the present case, use may be made of the spring that has an area with a constant, non-rising characteristic between two linear areas.

The spring means 35 and the holding plates 37 can also be fabricated from one piece, if required. Of course, instead of the spiral spring elements illustrated it is also possible for disk springs, which can be, for example, star-shaped, triangular, round or else spherical, to be provided as spring means 35.

As may further be seen from FIG. 16, the reflecting surface 12 is formed not by a recess in the facet body 17, but by flattening off or "halving" a spherical body.

Figure 17:
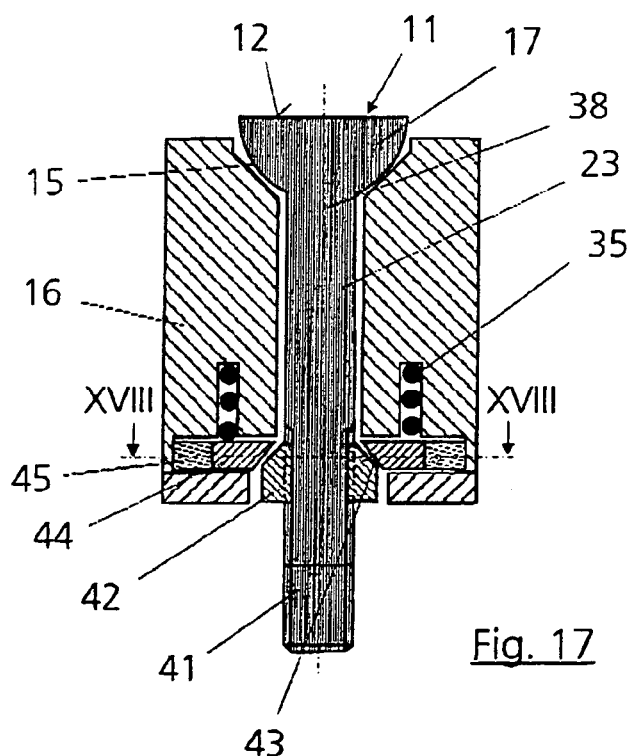
FIG. 17 shows a cross section through a refinement of a facet mirror with a ball-nut as abutment for a mirror facet.
Figure 18:
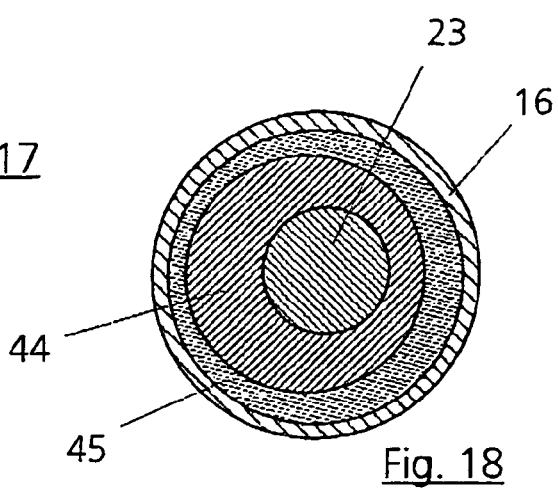
FIG. 18 shows a cross section through the line XVIII-XVIII of figure 17.

FIG. 17 shows a configuration for the mounting of a mirror facet 11, the guide member 23 being provided with a thread 41 on its end region averted from the facet body 17. A ball-nut 42 is screwed onto the thread 41. The ball-nut 42 bears against a conical surface 43 of an eccentric disk 44 with its part facing the facet body 17. The eccentric disk 44 is surrounded by a second eccentric disk 45. The spring means 35, which is supported in the carrier plate 16, biases the eccentric disk 44 in the direction of the conical surface 43. Freedom from play is achieved in this way for the bearing of the guide member 23.

All that is required to adjust or set the mirror facet 11 is to rotate the two eccentric disks 44, 45 relative to one another by means of setting members (not illustrated), the result being to carry out corresponding tilting movements of the axis of symmetry 38, and thereby carry out settings for the reflecting surface 12. The rotations of the two eccentric disks 44, 45 relative to one another are performed about an axis that runs parallel to the axis of symmetry 38.

In addition to a freedom from play for the bearing of the mirror facet 11, the spring means 35 also produces a clamping of the mirror facet 11. Here, as well, after adjustment has been performed the two eccentric disks 44, 45 are fixed in relation to one another and also with respect to the carrier plate 16, for example by means of adhesive.

In order to achieve a far reaching freedom from play for the thread 41, the guide member 23 and for the ball-nut 42, the threads 41 can be coated with a deformable layer, for example a gold layer.

Figure 19:
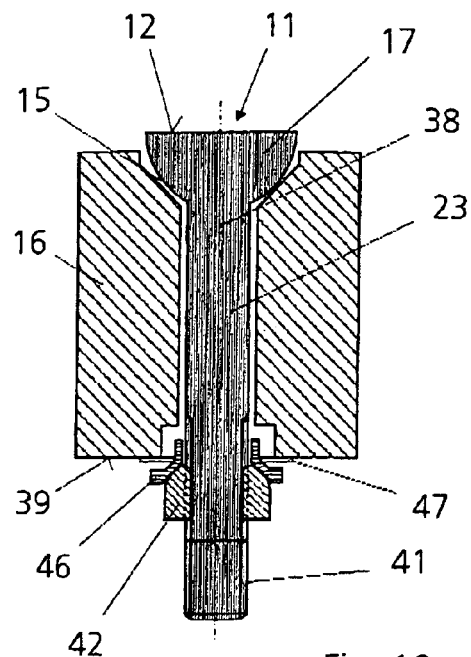
FIG. 19 shows a cross section through a refinement of a facet mirror with a ball-nut as abutment, which exhibits a refinement similar to that illustrated in FIG. 17.

FIG. 19 shows a similar configuration to the bearing illustrated in FIG. 17. In this case, however, the ball-nut 42 is not mounted in a conical surface of an eccentric, but in a sleeve 46 that likewise has for this purpose a conical surface on the side facing the ball-nut 42. The sleeve 46 is surrounded at the outer circumference by a disk spring 47. The disk spring 47 can be displaced, transverse to the axis of symmetry 38, on the setting surface 39 on the underside of the carrier plate 16, as a result of which setting can be performed in accordance with the position of the reflecting surface 12.

After adjustment has been performed by an appropriate displacement of the disk spring 47, fixing can be carried out in turn by bonding, for example on the spherical support of the mirror facet 11 in the bearing device 15 or on the disk spring 47.

Figure 20:
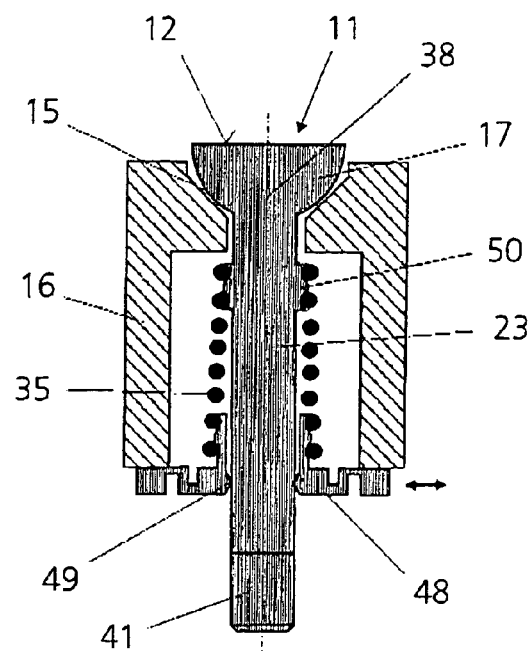
FIG. 20 shows a cross section through a refinement of a facet mirror with a diaphragm as abutment for a mirror facet.

FIG. 20 shows a bearing with a possibility of adjustment, a diaphragm 48 being screwed onto the thread 41 on the side of the guide member 33 averted from the facet body 17. The spring means 35 in turn draws the facet body 17 against the carrier plate 16. The same holds for the diaphragm 48. The mirror facet 11 is clamped in in this way. The fastening of the mirror facet 11 on the side averted from the bearing device 15 can be performed by means of a number of points or a blade 49 on the inner circumference of the diaphragm 48, the mirror facet 11 being rotatably mounted thereby. The bearing points or the blade 49 are expediently coated with a deformable layer. The setting of the reflecting direction for the reflecting surface 12 is performed by an appropriate movement of the diaphragm 48 in the direction of the arrow along the underside of the carrier plate 16. Here, as well, the diaphragm 48 is fixed after the adjustment on the carrier plate 16 has been performed, and so the mirror facet 11 can no longer be moved. The spring means 35 is supported on a step 50 on a side at the guide member 23, and is constructed as tension spring in order to achieve the freedom from play and the clamping.

Figure 21:
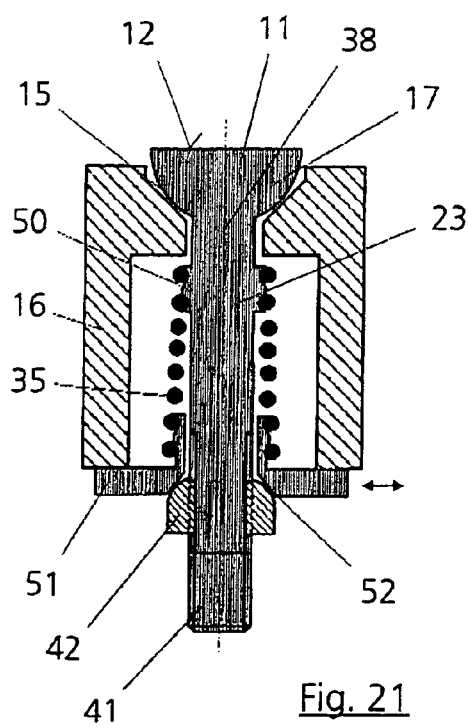
FIG. 21 shows a cross section through a refinement of a facet mirror with a conical disk as abutment for a mirror facet.

FIG. 21 shows an example of bearing and adjustment that corresponds substantially to the exemplary embodiment according to FIG. 20. Here, instead of the diaphragm 48 a ball-nut 42 is screwed, in turn, onto the thread 41 of the guide member 23, and is accommodated with its spherical part in a conical receptacle 52 of the conical disk 51 and mounted free from play by the spring means 35. This refinement likewise exhibits an approximately symmetrical bearing for both bearing receptacles. The ball-nut 42 and the conical receptacle 52 of the conical disk 51 are expediently likewise coated with a deformable layer. By displacing the conical disk 51 in the direction of the arrow, the reflecting surface 12 of the mirror facet 11 is also set here in the carrier plate 16. Here, as well, the conical disk 51 can be fixed by bonding after adjustment has been performed.

Figure 22:
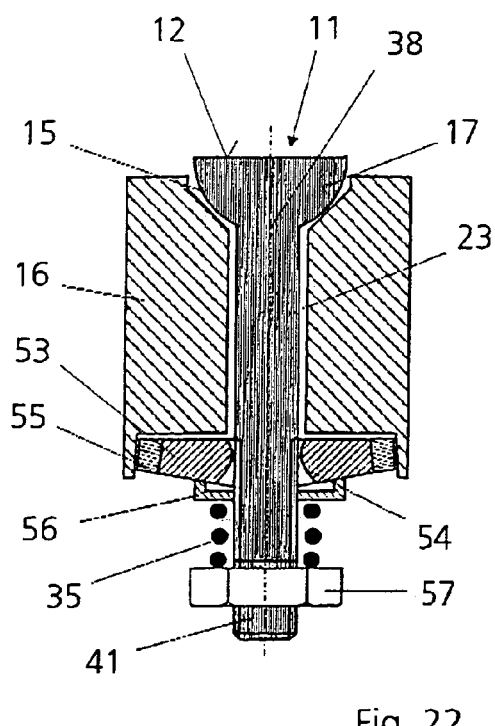
FIG. 22 shows a cross section through a refinement of a facet mirror with a pressing disk and two eccentric disks as abutments for a mirror facet.

FIG. 22 shows a refinement for mounting a mirror facet 11, and for adjusting it with the aid of an eccentric disk 53 that is provided on the inside with a toroidal cutout 54. The guide member 23 is guided and mounted in the toroidal cutout 54. The eccentric disk 53 is surrounded by a further eccentric disk 55. A pressing disk 56 ensures biasing onto the eccentric disk 53. For this purpose, the spring means 35 is pressed with one end against the pressing disk 56 on the side averted from the ball head 17, while the other end of the spring means 35 is supported at a nut 57 that is screwed onto the thread 41 of the guide member 23. Thus, the spring means 35 can be used not only to press the pressing disk 56 and the two eccentric disks 53 and 55 against the carrier plate 16, but also to clamp in the mirror facet 11. A design free from play is also achieved here when a deformable layer is provided between the pressing disk 56 and the eccentric disks 53, 55.

The adjustment of the reflecting surface 12 is performed in the same way as for the exemplary embodiment illustrated in FIG. 17 by an appropriate rotation of the two eccentric disks 53, 55. The same holds for the subsequent fixing.

Figure 23:
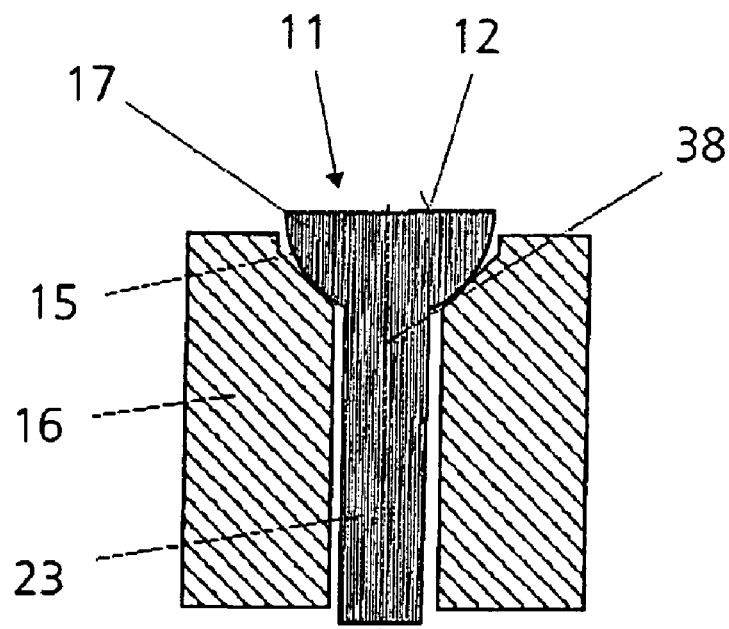
FIG. 23 shows a bearing device for a mirror facet with a facet body in hemispherical form and a spherical receptacle.

FIGS. 23 and 24 once again show a brief description of two possible bearing devices for the mirror facet 11. FIG. 23 in this case shows a configuration with a facet body 17 as spherical joint for the mirror facet 11, which is situated opposite a spherical receptacle in the carrier plate 16 as bearing device 15.

Figure 24:
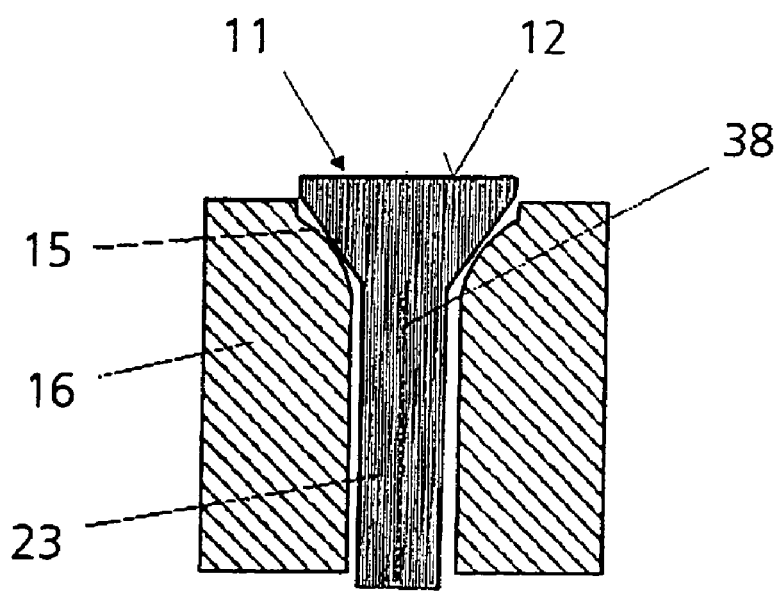
FIG. 24 shows a bearing device for a mirror facet with a facet body in conical form and a toroidal receptacle.

By contrast therewith, in accordance with FIG. 24 the mirror facet is constructed in the shape of a cone instead of in the shape of a hemisphere, there also being an axis of symmetry in this case. Given a conical shape, the bearing device 15 has a trumpet-like or toroidal seating surface.

The design or the configuration of the rear fastening or bearing for the mirror facet 11 can also be varied in accordance with a spherical or conical shape.

What is claimed is:

1. A facet mirror, comprising:
   a carrier plate;
   a plurality of mirror facets, each of said mirror facets including a facet body having a bearing surface and a reflecting surface, said bearing surface being of a spherical or conical shape and being located on a side of said facet body averted from said reflecting surface, each said facet body being mounted adjustably in a bearing device arranged in said carrier plate, said side of each said facet body being provided with a guide member on which control means for adjusting said facet body act, said guide member having an end region averted from said reflecting surface, said end region being provided with a spherical or conical bearing member that forms an abutment relative to said bearing device, said guide member being arranged with play in said carrier plate, said control means acting on said bearing member.

2. The facet mirror as claimed in claim 1, wherein said bearing member is accommodated in a receptacle, adapted to the shape of said bearing member, of a holding plate, it being possible for the holding plate to be displaced at right angles to the axis of symmetry of the facet body.

3. The facet mirror as claimed in claim 2, wherein said holding plate can be displaced in relation to the carrier plate in order to adjust said mirror facet.

4. The facet mirror as claimed in claim 3, wherein after the adjustment said holding plate is fixed in relation to said carrier plate.

5. The facet mirror as claimed in claim 1, wherein said bearing device and said bearing member are clamped against one another by spring means.

6. The facet mirror as claimed in claim 5, wherein a spring constant of said spring means is provided with a plateau in the force-displacement diagram.

* * * * *

UNITED STATES PATENT AND TRADEMARK OFFICE
CERTIFICATE OF CORRECTION

PATENT NO. : 7,354,168 B2
APPLICATION NO. : 10/848210
DATED : April 8, 2008
INVENTOR(S) : Hubert Holderer et al.

It is certified that error appears in the above-identified patent and that said Letters Patent is hereby corrected as shown below:

On the Title Page Item (75)
  delete "Konigsbronn" and replace with --Koenigsbronn--

On the Title Page Item (75)
  delete "Jurgen" and replace with --Juergen--

Column 2, line 33
  delete "as," and replace with --as--

Column 5, line 4
  delete "wave-lengths" and replace with --wavelengths--

Column 5, line 63
  delete "been-supplemented" and replace with --been supplemented--

Column 9, line 2
  delete "The," and replace with --The--

Column 9, line 37
  delete "set-screw" and replace with --setscrew--

Column 9, line 42
  delete "set-screw" and replace with --setscrew--

UNITED STATES PATENT AND TRADEMARK OFFICE
CERTIFICATE OF CORRECTION

PATENT NO. : 7,354,168 B2
APPLICATION NO. : 10/848210
DATED : April 8, 2008
INVENTOR(S) : Hubert Holderer et al.

It is certified that error appears in the above-identified patent and that said Letters Patent is hereby corrected as shown below:

Column 9, line 63
  delete "as,is" and replace with --as is--

Signed and Sealed this

Twenty-first Day of October, 2008

JON W. DUDAS
*Director of the United States Patent and Trademark Office*